(12) United States Patent
Conradi et al.

(10) Patent No.: US 8,325,323 B2
(45) Date of Patent: Dec. 4, 2012

(54) METHOD AND SYSTEM FOR CORRECTING IMAGE CHANGES

(75) Inventors: Olaf Conradi, Westhausen/Westerhofen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 815 days.

(21) Appl. No.: 12/361,842

(22) Filed: Jan. 29, 2009

(65) Prior Publication Data
US 2009/0153831 A1 Jun. 18, 2009

Related U.S. Application Data (63) Continuation of application No. PCT/EP2007/058852, filed on Aug. 25, 2007.

(30) Foreign Application Priority Data

Aug. 25, 2006 (DE) .................. 10 2006 039 895

(51) Int. Cl.
G03F 7/20 (2006.01)
(52) U.S. Cl. ........................................ 355/52; 355/68
(58) Field of Classification Search .................. 355/52, 355/67, 68, 77; 359/820
See application file for complete search history.

(56) References Cited

U.S. PATENT DOCUMENTS

| 4,730,900 | A | 3/1988 | Uehara et al. |
|---|---|---|---|
| 5,423,896 | A * | 6/1995 | Nishiguchi et al. ........... 359/853 |
| 5,614,990 | A | 3/1997 | Bruce et al. |
| 6,198,579 | B1 | 3/2001 | Rupp |
| 6,504,597 | B2 | 1/2003 | Schuster et al. |
| 6,707,537 | B2 | 3/2004 | Dieckmann et al. |
| 6,912,077 | B2 | 6/2005 | Weiss et al. |
| 2001/0043321 | A1* | 11/2001 | Nishi et al. ...................... 355/67 |
| 2002/0075466 | A1* | 6/2002 | Gruner et al. ................... 355/53 |
| 2003/0053036 | A1* | 3/2003 | Fujishima et al. .............. 355/53 |
| 2004/0227914 | A1 | 11/2004 | Hara |
| 2005/0206850 | A1* | 9/2005 | Shimizu et al. ................. 353/55 |
| 2005/0254024 | A1* | 11/2005 | Marie Van Greevenbroek et al. .............................. 355/30 |

FOREIGN PATENT DOCUMENTS

| DE | 199 63 588 | 7/2001 |
|---|---|---|
| DE | 10000191 | 7/2001 |
| DE | 100 40 998 | 3/2002 |
| EP | 0 823 662 | 2/1998 |
| EP | 1 584 983 | 10/2005 |
| WO | WO 01/63233 | 8/2001 |

* cited by examiner

*Primary Examiner* — Glen Kao
(74) *Attorney, Agent, or Firm* — Fish & Richardson P.C.

(57) ABSTRACT

The disclosure relates to a method for compensating image errors, generated by intensity distributions in optical systems, such as in projection lens arrays of microlithography systems, and to respective optical systems, such as projection lens arrays of microlithography systems.

52 Claims, 5 Drawing Sheets

METHOD AND SYSTEM FOR CORRECTING IMAGE CHANGES

CROSS-REFERENCE TO RELATED APPLICATIONS

This application is a continuation of, and claims priority under 35 U.S.C. §120 to, international application serial number PCT/EP2007/058852, filed Aug. 25, 2007, which in turn claims benefit of German patent application 10 2006 039 895.5, filed Aug. 25, 2006. The contents of international application PCT/EP2007/058852 are hereby incorporated by reference.

FIELD

The disclosure relates to a method for compensating image errors, generated by intensity distributions in optical systems, such as in projection lens arrays of microlithography systems, and to respective optical systems, such as projection lens arrays of microlithography systems.

BACKGROUND

It is known to compensate deviations in optical systems, which can be caused by a high thermal loading of the optical elements.

SUMMARY

In some embodiments, the disclosure provides a method and a device through which aberrations, which are caused through intensity distributions in optical systems, can be compensated in a relatively simple and/or a relatively effective manner. This can be achieved while simultaneously providing a good compensation of the image changes and also a small restriction of the useful operating time of the optical system.

In some embodiments, the disclosure provides a method that includes: a) determining at least one location-dependent and time dependent intensity distribution in at least one optical element of a projection optical system of the projection exposure device; b) subsequently determining at least one location-dependent and time-dependent absorbed energy in the optical element; c) subsequently determining at least one deformation and change of optical properties of the optical element caused by the absorbed energy; and d) subsequently selecting one or several compensation measures depending on information obtained in steps a) through c).

In certain embodiments, the discloses a method that includes: a) determining at least one location-dependent and time dependent intensity distribution in at least one optical element of an optical system; b) determining at least one location-dependent and time-dependent absorbed energy in the optical element for which the intensity distribution has been determined; c) determining at least one deformation and change of optical properties of the optical element caused by the absorbed energy; and d) selecting one or several compensation measures, depending on the results of steps a) through c). Step a) by a calculation based on at least one of the diffraction angle- and location-dependent intensity distribution. At least one of the diffraction angle- and location-dependent intensity distribution is determined or considered, based on the measurement of the intensity in at least one plane of the optical path, transverse to the optical axis of the optical system. The at least one plane has a paraxial sub aperture ratio in a range selected from the group consisting of −0.25 to +0.25, −0.75 to −1, 0.75 to 1, and/or if the at least one plane includes more than one plan two planes with different prefixes of the paraxial sub aperture ratio and several planes with equidistantly spaced paraxial sub aperture ratios.

In some embodiments, the disclosure provides a projection lens for microlithography. The projection lens includes at least one optical element and at least one image detector capable of being located in an optical path of the optical system so that the at least one detector can directly measure a location-resolved and/or time resolved intensity distribution in the optical path.

In certain embodiments, a computational simulation of image changes caused by intensity distributions in optical systems is performed, and one or several compensation measures are performed, based on the obtained computational simulation.

The disclosure is based, in part at least, on the understanding that the intensity distribution can be determined, especially mathematically determined in or at one, several or all optical elements of the optical system based on the knowledge of the diffraction angle- and field-dependent intensity distribution originating from the object to be imaged and as well as the type, intensity or illumination strength of the illumination source, and the optical path through the optical system or the lens array.

Due to the determined location- and/or time dependent (e.g. in case of pulsed illumination) intensity distribution in or at least one optical element of the optical system, the absorbed energy, depending on time and/or location, can then be determined and computed in a subsequent step in the optical element, or the optical elements, for which the intensity distribution has been determined. For this purpose, it is sufficient to know only the absorption behavior of the optical elements, this means, of the volume material, and of the layers possibly deposited thereon.

Due to the knowledge of the imparted energy, location and/or time based temperature distributions, or deformations derived from them, and/or changes of the optical features of the respective optical element can be determined or computed, such as through solving heat transfer equations.

For this purpose it is desirable to know the material and shape and the environmental conditions of the optical elements, as e.g. shape and material of the mountings of the optical elements, and the respective thermal expansion coefficients and the temperature dependency of the refractive index of the materials, in order to be able to perform the respective computations.

With a corresponding method, it is thus possible to determine the location- and time dependent changes of the optical system, and thus the wave front deviations, depending on location and time, or to simulate them mathematically, without having to perform a measurement. Only the intensity or the luminosity of the illumination source can e.g. be determined through a corresponding measurement.

It can be advantageous in this method that with a given illumination, and with a given object to be imaged, e.g. a reticle, the simulation substantially only is performed once, and the correction can be performed, without having to interrupt the use of the optical system. This can be a substantial advantage, because in certain known systems, e.g. in the method described in WO 01/63233 A2 for determining the wave front deviation, an interruption of the use of the optical system occurs.

Through the knowledge of the changes of the optical system due to the light- or thermal load, the respective compensation methods can be applied, e.g. moving the optical elements along or perpendicular to the optical axis, and/or pivoting the optical elements around an axis, orthogonal to the optical axis, and/or rotating the optical elements around a axis parallel to the optical axis and/or deforming optical elements. Also cooling or heating of optical elements through Peltierelements, as described e.g. in U.S. Pat. No. 6,198,579 B1, can be controlled accordingly. Furthermore, known methods for additional heating of the optical elements by irradiation can be applied alone or together with other methods of compensation when the computational simulation is known.

Furthermore, the reticle- and/or substrate stage can be moved, or changes in the operating wave length can be performed, in order to compensate or correct imaging errors.

It is desirable, however that the diffraction angle- and field-dependent intensity distribution, which is given through the object to be imaged, e.g. a reticle, is known, in order to be able to perform the simulation.

In case the information about the object to be imaged, or the reticle is not sufficiently available, or not available at all, or in order to check the simulation and/or to improve it, an intensity measurement in the optical path of the optical system can be performed especially in advance to the determination, simulation or calculation of the intensity distribution in a refinement of the method. The intensity measurement allows to compute back to the diffraction angle- and/or location-dependent intensity distribution, due to the object to be imaged, and to determine respectively the location- and/or time dependent intensity distribution in one, several or, optionally, all optical elements of the optical system based on the optical path information, which is available for the lens array.

The measurement of the intensity can be performed for a given combination of illumination and object to be imaged (reticle) one time in a single plane, which can be orthogonal with optical axis. This can allow considerable time advantages with respect to the use of the optical system.

Optionally, several measurements are performed in various planes of the optical path, which are optionally spaced in an equidistant manner, in order to be able to process information from different planes in the computational simulation.

For the planes, where the intensity is to be measured, the pupil plane, or a plane close to the pupil is suitable in particular, since, on the one hand, many optical elements of typical lithographic optical systems are disposed close to the pupil, and contribute to the heating induced image errors, and since, on the other hand, the critical small illumination poles, or other error determining characteristics of the diffraction angle distribution are directly visible here as a local distribution.

Alternatively, or as a supplement, planes close to the field, or field planes, or planes conjugated accordingly, and/or other planes in the optical path can be selected for the intensity measurement. For example, effects caused by the rectangular shape of the reticle, or its loading with various structures can rather be determined close to the field, so that optionally a supplemental measurement close to the field makes sense.

The planes for the intensity measurement can be selected in particular through their paraxial sub aperture ratio. The paraxial sub aperture ratio is given through:

$$\text{sign} y_i \cdot \frac{y_i}{|y_i| + |\bar{y}_i|}$$

wherein $y_i$ is the paraxial boundary beam elevation and $\bar{y}_i$ the paraxial main beam elevation. A definition of the paraxial boundary beam, or the paraxial main beam is given in "Fundamental Optical Design" by Michael J. Kidger, SPIE PRESS, Bellingham, Wash., USA, which is incorporated by reference herein.

The paraxial sub aperture ratio is a quantity with a prefix, which is a measure for the field- or pupil closeness of a plane in the optical path. Per definition, the sub aperture ratio is standardized to values between −1 and +1, wherein e.g. each field plane has a paraxial sub aperture ratio of +1 or −1 associated with it, and each pupil plane has a paraxial sub aperture ratio of 0 associated with it. Accordingly, paraxial sub aperture ratios of +1 or −1 designate field planes for the present patent application, wherein the sub aperture ratio of 0 determines pupil planes. Planes close to the field thus have paraxial sub aperture ratios in the range of +1 or −1, while planes close to the pupil have a sub aperture ratio close to 0. The prefix designates the position of the plane in front of, or behind a reference plane. For definition purposes, e.g. the prefix of the penetration point of a coma beam in the pertaining plane can be used. Optionally, at least two planes can be used for intensity measurement with different prefixes of the paraxial sub aperture ratio, wherein the absolute value of the paraxial sub aperture ratio can be identical in particular.

In case of a scanning illumination of the object (reticle) to be imaged, it can be advantageous to perform the measurement of the intensity distribution also during a scan process, and optionally to perform a time resolved measurement of the intensity in the respective plane. Thus, the changes in the diffraction intensity distribution can be determined during the scanning process. However, also an integrated, i.e. an intensity measurement summed up over time and/or an intensity measurement averaged over time and/or scan averaged intensity distribution can be sufficient, since the time duration of the scan process with respect to the other involved time constants, e.g. with respect to thermal conduction, is kept very small.

In order to be able to perform a time resolved intensity distribution, the scan process can optionally also be performed proportionally slowed down with respect to ordinary operation, in order to thus allow a time resolved intensity measurement.

The intensity measurement can be especially directed to, on the one side, the detection of the distribution of angle of incidence of the image light (radiation) and/or, on the other side, to the direct location-resolved intensity measurement, depending on the plane of the intensity measurement. The detection of incident angle distribution is carried out in a field plane or field-close plane while the immediate location-resolved intensity distribution can be seen in a pupil plane or a pupil-close plane.

Accordingly, also systems, which have mechanisms for measuring the wave front deviations, like e.g. described in WO 01/63233 A2, can be used. In WO 01/63233 A2, e.g. a diffraction detector unit is described, which can be disposed in the image plane. When using e.g. the diffraction grid as a pinhole, an intensity distribution can be determined by the subsequent detector, which can be used. Accordingly, the disclosure of WO 01/63233 A2, is incorporated herein by reference in its entirety. Furthermore, the intensity measurement can be performed through any suitable intensity measurement mechanism, such as image detectors, optionally CCD cameras or CCD arrays.

As mentioned above, the intensity measurement may be only involved, if the diffraction angle distribution of the object to be imaged (reticle) and/or the illumination intensity of the light source (radiation source) or of the illumination system is not or not sufficient known or if by the additional intensity measurement the accuracy of compensation of the image errors by approximation towards the actual conditions shall be improved. Accordingly, it is sufficient to carry out only a single intensity measurement, since based on the information received in this way about the diffraction angle- and/or position-dependent intensity distribution the beam course in the optical system can be determined mathematically.

In order to minimize the calculation effort or keep the operating expense low and/or in order to be able to adapt or to check the simulation with respect to the actual conditions, it may be advantageous to repeat intensity measurements in pre-defined intervals.

In some instances, a new measurement is used only if the image conditions are changed, thus if for example the illumination settings are changed or another object to be imaged (reticle) is present. Especially for modern projection exposure systems different illumination settings, for example dipole illumination, quadrupole illumination or similar may be chosen for different reticles so that the image conditions may be changed simultaneously with respect to illumination setting and to the object to be imaged.

Furthermore, the image conditions may be also changed by amendments at the optical system, e.g. the projection optical system of the projection exposure device. This refers for example to an amendment of one or several optical elements for example by rotation, manipulation, displacement and/or deformation. Such manipulation of the optical elements may be desired for example for the compensation of image errors. Furthermore, other amendments of the image conditions, e.g. different polarization settings are possible.

In order to keep the useful operating time of the optical system as high as possible, the intensity measurement can optionally be performed during a substrate exchange in projection lens arrays of microlithography systems.

The process steps for determining of the position- and/or time-dependent absorbed energy of at least one optical element as well as the determining of the temperature distribution following from this for the at least one optical element can also be carried out by calculation. Only information on the shape and properties of the materials of the optical element as well as on the environment of the optical element as for example the mountings, are involved. This information may be collected in advance by corresponding measurements, as for example absorption measurement.

The calculation of the position- and/or time-dependent absorbed energy and/or temperature distribution can be carried out by different mathematic methods. These methods include finite element analysis, different finite methods, eigenmode-analysis, iterative numerical methods or analytical assessments.

Accordingly, deformations of the optical element and/or changes of the optical properties may be determined by corresponding calculation methods based on the information received on the absorbed energy and/or temperature distribution. For example, the deformation may be determined by finite element analysis.

From the deformations and/or other changes of the properties of the optical elements corresponding image errors may be determined and/or assessed so that corresponding compensation measures may be carried out. The compensation measures may be chosen from all known and possible compensation measures, for example displacement of one or several optical elements along and/or transverse to the optical axis, tilting or rotating of one or several optical elements around an axis transverse or parallel to the optical axis, deformation of one or several optical elements, cooling and/or heating of at least part of the optical element as already described above.

The process steps are optionally performed online during the use of the optical system, wherein in particular after a performed intensity measurement, e.g. in case of a substrate change, the illumination of the subsequent substrates is continued immediately, while at the same time the compensation or correction of imaging errors is performed.

The process steps are thereby optionally performed completely automated, or at least partially automated.

It can be advantageous to perform the process steps several times in a row, in particular with intensity measurements in various planes, in order to allow a refinement of the mathematical simulation through the different information. It is appreciated, however, that as a matter of principle the process only has to be performed once with respect to the computation, and also when an intensity measurement is used, as far as a constant combination of object to be imaged and illumination is given.

The disclosure also relates to a respective optical system for imaging an object, in particular to a projection lens array for microlithography, in which at least one, optionally several, image detectors for intensity measurement can be located in the optical path, where the image detectors can directly measure the location- and/or time resolved intensity distribution in the beam path of the optical system.

As used herein, directly means that a diffraction grating does not necessarily have to be used in front, like in the diffraction grating detector unit according to WO 01/063233 A2 but that the intensity measurement is performed directly by the corresponding image detector, such as, for example, a CCD camera.

In order to be able to use the image detectors e.g. during a substrate change, and in order to avoid in this context that during the substrate change the exiting, or the fresh added substrate are already being irradiated through respective light, the detectors can be aligned so that they have a shielding, which can avoid light passing through the detector plane during the intensity measurement.

Since the intensity measurement only has to be performed from time to time, and in particular only once for a set combination of illumination and object to be imaged (reticle), the detectors are provided so that they can be moved into the optical path, and that they can be removed from it again, such as through linear movement or pivoting.

Furthermore, a respective optical system optionally has an electronic processing unit with respective storage mechanisms and processors, which captures the detected intensity values, and processes them based on stored or entered information, and controls or regulates actuators for performing compensation measures. The processing unit can also take over controlling or regulating the detectors in the same manner.

BRIEF DESCRIPTION OF THE DRAWINGS

Further advantages, characteristics, and features of the disclosure become apparent from the subsequent detailed description and the appended figures, in which:

FIG. 4 is an illustration of developing of image errors over time; and in

DETAILED DESCRIPTION

Figure 1:
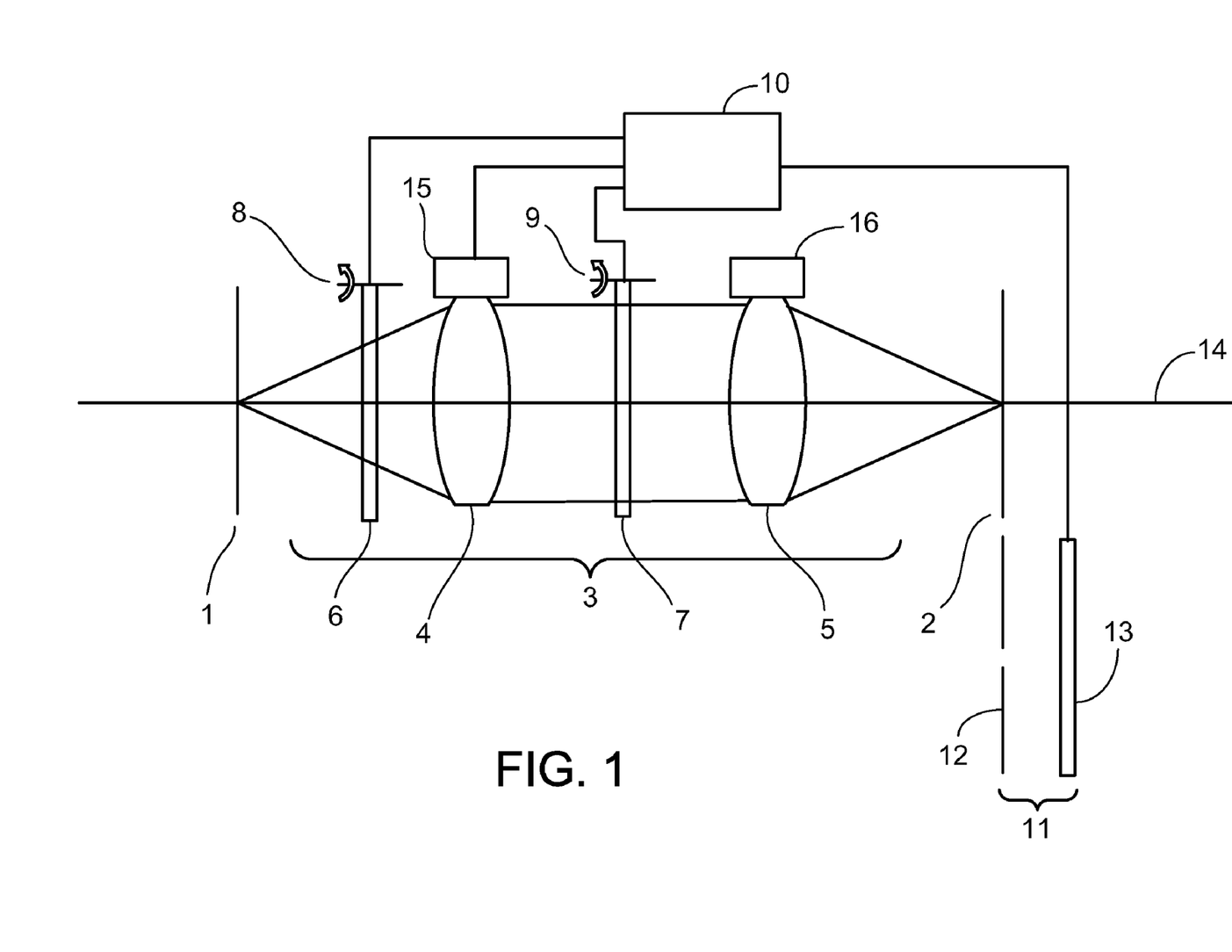
FIG. 1 is an illustration of a microlithography projection lens array.

FIG. 1 shows a highly simplified projection exposure lens array for microlithography in a purely schematic illustration.

The exposure projection lens array 3 reproduces a reticle 1 in an image plane 2, in which the substrate is located. The exposure projection lens array 3 has two optical elements provided as optical lenses 4 and 5, which create the image, in the illustrated, highly simplified case. In reality, such projection illumination lens array includes a multitude of optical elements, wherein besides optical lenses also mirrors can be used. The highly simplified layout of the illustrated exposure projection lens array only serves the purpose of a simplified and clear illustration. Actually, a plurality of very different optical systems can be used.

In the embodiment shown in FIG. 1, two image detectors 6 and 7 are provided as CCD cameras, which can be pivoted into the optical path, or removed from it again through pivot devices 8 and 9, which are also illustrated schematically. The arrangement of the image detectors 6 and 7 is performed transversally, in particular orthogonal to the optical axis 14. Though it is shown that two image detectors are provided in the optical path, it is also possible to provide only one image detector for insertion into the optical path, or a larger number of image detectors.

The image detectors 6 and 7 are connected with a processing unit 10 through signal and/or control lines, wherein the processing unit 10 registers the measured data and controls the detectors.

Besides the image detectors 6 and 7 in the embodiment shown in FIG. 1, an additional diffraction grating detector unit 11 is provided, which has a pinhole 12 as a diffraction grating, and also an image detector in the form of a CCD camera. These are disposed in the lens array, so that they can be brought into the optical path in the area of the image plane 2, wherein the diffraction grating, or the pinhole 12 is located in the area of the focus of the image plane 2, wherein the image detector 13 of the diffraction grating detector unit 11 is located remote outside of the focus, and can thereby determine the intensity distribution of the light diffracted at the pinhole 12.

This corresponds to the detector system as described in WO 01/63233 A2, wherein the disclosure of WO 01/63233 A2 is incorporated into the present application in its entirety by reference.

Also the image detector 13 is connected with a processing unit 10, which registers and processes the intensities detected by the image detectors, and controls the unit 11.

The image detectors allow a location resolved measurement of the light intensities. Furthermore, the detection can be performed in a time resolved manner, so that location- and/or time resolved intensity information is available through the image detectors 6, 7, and 13, with reference to the detector planes in the optical path, or subsequently at the image detector 13. The time resolved intensity detection is advantageous in particular, when the illumination of the reticle 1 is not performed simultaneously for the entire reticle, but through scanning the reticle with an illumination beam. In this case, a time based distribution can already occur through the illumination, without considering heating effects.

At the optical elements 4 and 5 actuators 15 and 16 are provided, which are connected with the processing unit through control lines, and which can be controlled or regulated by it, so that they perform compensation measures like e.g. linear displacements, tilting, or deforming of the optical elements 4 and 5, depending on the determined changes of the optical system.

The projection lens array, which is shown in a schematic simplified manner in FIG. 1, can now be operated in the following manner.

With a given illumination of the reticle 1 through an illumination lens array (not shown), the location and/or time based intensity distribution in the optical elements 4 and 5 can be computed, when the structure of the reticle 1 and the optical path of the projection lens array 3 are known. Due to knowledge of the absorption characteristics of the material of the optical elements 4 and 5, and of the layers possibly deposited thereupon, the amount of energy absorbed can be calculated in a location and/or time based manner. Together with information about the shape, the environment, in particular about the mountings of the optical elements, and about the thermal conductivity of the respective components, a location and/or time based temperature distribution can be determined. With this information, based on respective materials parameters, like thermal expansion coefficients, or temperature dependency of refraction indices, the deformation of the optical elements through the temperature load and the change of the optical properties, in particular with respect to the refraction index, due to temperature changes can be determined.

Then, based on this information, a corresponding compensation can be performed by movement of the optical elements 4 and 5 along the optical axis 14, or transversal to the optical axis 14, by pivoting the optical elements 4, 5 around an axis, orthogonal or parallel to the optical axis 14, or by deforming the optical elements 4 and 5 through the actuators 15 and 16. This is performed based on the image changes determined by the processing unit 10, and according to certain compensation measures.

As an additional compensation measure, furthermore, a movement of the reticle- or substrate table, or a change of the operating wave length of the light employed are possible. Such a compensation of image deviations due to the intensity distribution in the optical system can initially be performed independently from intensity measurements. For this purpose, exact information about the reticle structure, and the diffraction angle- and field-dependent intensity distributions caused thereby, are involved.

These, however, are not always available, so that in this case the lacking information is replaced by corresponding intensity measurements in the beam path of the optical system, or determined through these measurements.

Furthermore, through respective intensity measurements, also imprecisions of the simulation, as they can be induced e.g. through non exact knowledge of the boundary conditions, can be considered and compensated.

Accordingly, respective intensity measurements through image detectors, like CCD-cameras can be performed in one or several planes of the optical path. The measurement results are being processed in the processing unit 10 for determining the deformations occurring at the optical elements 4 and 5, and the refraction index changes, or generally changes of the optical properties, as already described above.

The intensity measurements can optionally be performed at times, in which no use of the optical system occurs, thus in projection lens arrays for microlithography, when no exposure occurs, e.g. during a substrate change. In order to avoid here that light reaches the substrate plane during the measurement, it is advantageous, to design the detectors 6 and 7 such, so that it is being avoided that light passes the detectors during measurement.

Though it is sufficient to perform only one intensity measurement at a given illumination and with a certain reticle 1, it can be advantageous to perform several measurements in various planes in order to thereby improve simulation.

Figure 2:
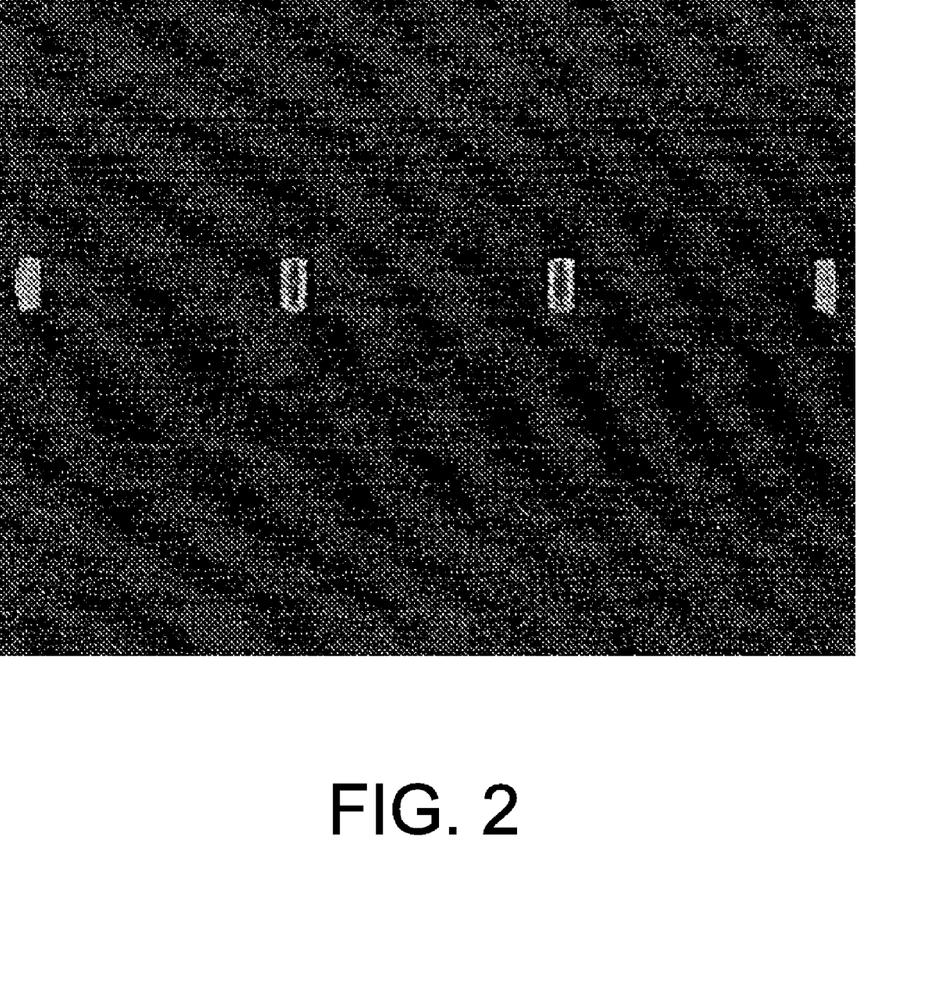
FIG. 2 is an illustration of a measured intensity distribution in a pupil plane, which has been generated through a first reticle.
Figure 3:
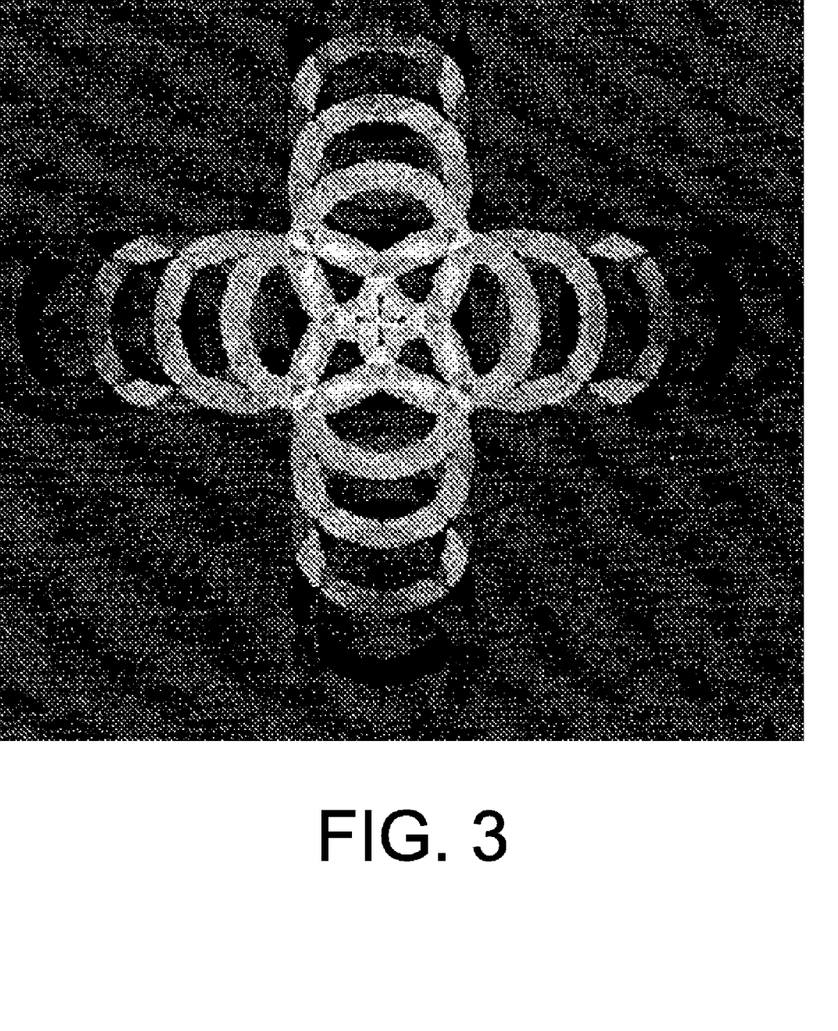
FIG. 3 is an illustration of an intensity distribution in a pupil plane, which has been generated through a second reticle.

Typically, preferred planes of the intensity measurement initially are the pupil plane or the planes close to the pupil, as it is the case with the image detector 7. There, the critical small illumination poles, or other error determining characteristics of the diffraction angle distribution are directly visible as location distribution, as it is shown in the FIGS. 2 and 3 for two different reticle structures.

In a supplementary or alternative manner however, the intensity can also be measured in other planes by the diffraction grating detector unit 11, as e.g. in the plane of the image detector 6, or in the area of the image plane, which can contribute to an improvement and supplementation of the simulation in particular in case of an additional measurement in addition to a pupil plane measurement. Overall, it can be determined however that the method is possible with measurements in any plane, though certain planes may be preferred. In particular through the design characteristics of the lens array, however some preferred planes may not be usable.

Figure 4:
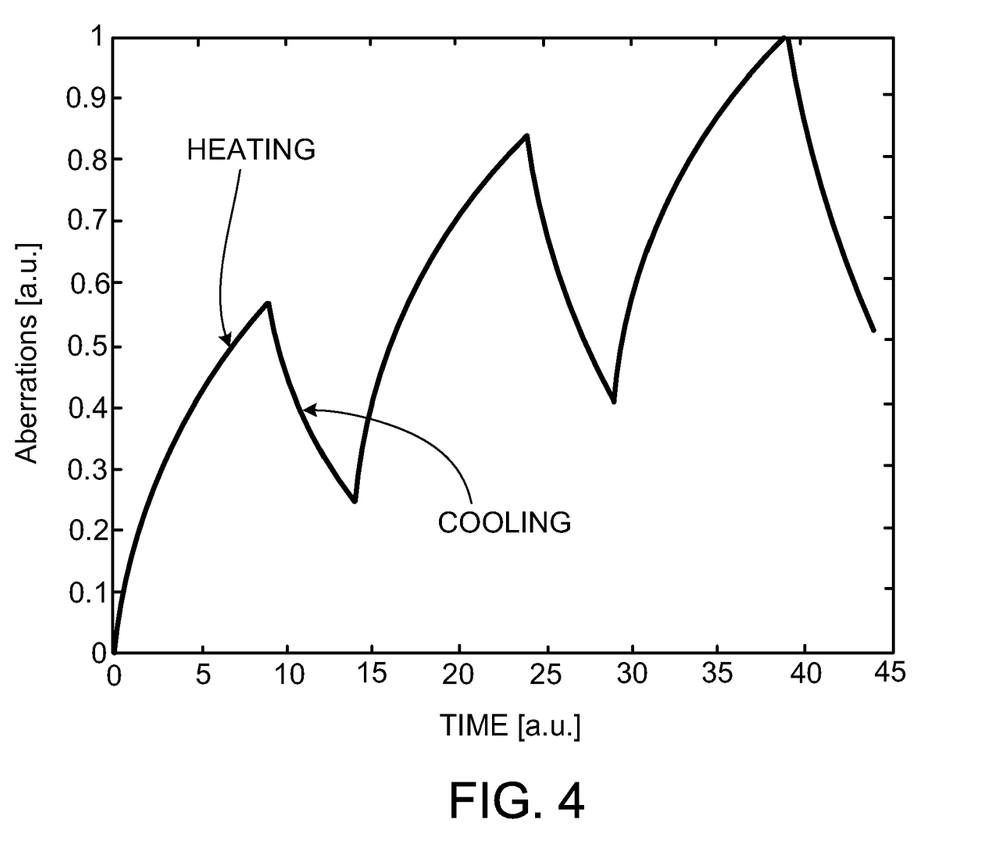

FIG. 4 shows the development of image errors depending on the time, wherein image error and time are only shown normalized and the diagram only gives qualitative information. However, the diagram shows that during each operation cycle, i.e. the corresponding heating-up due to irradiation and the subsequent cooling-down after switching off the irradiation, initially during heating-up of the optical elements an increase of image errors occurs, while during cooling the image errors partially de-generate again. However, some image errors remain due to permanent alteration of the optical elements. Through additional cycles the permanent image errors slowly increase up to a saturation value. The temperature induced increase of image errors occurs however again in every cycle. Due to the inventive method and the corresponding device it is possible to exactly detect these image errors caused by radiation and the heating of the optical elements and to initiate corresponding compensation methods.

Figure 5:
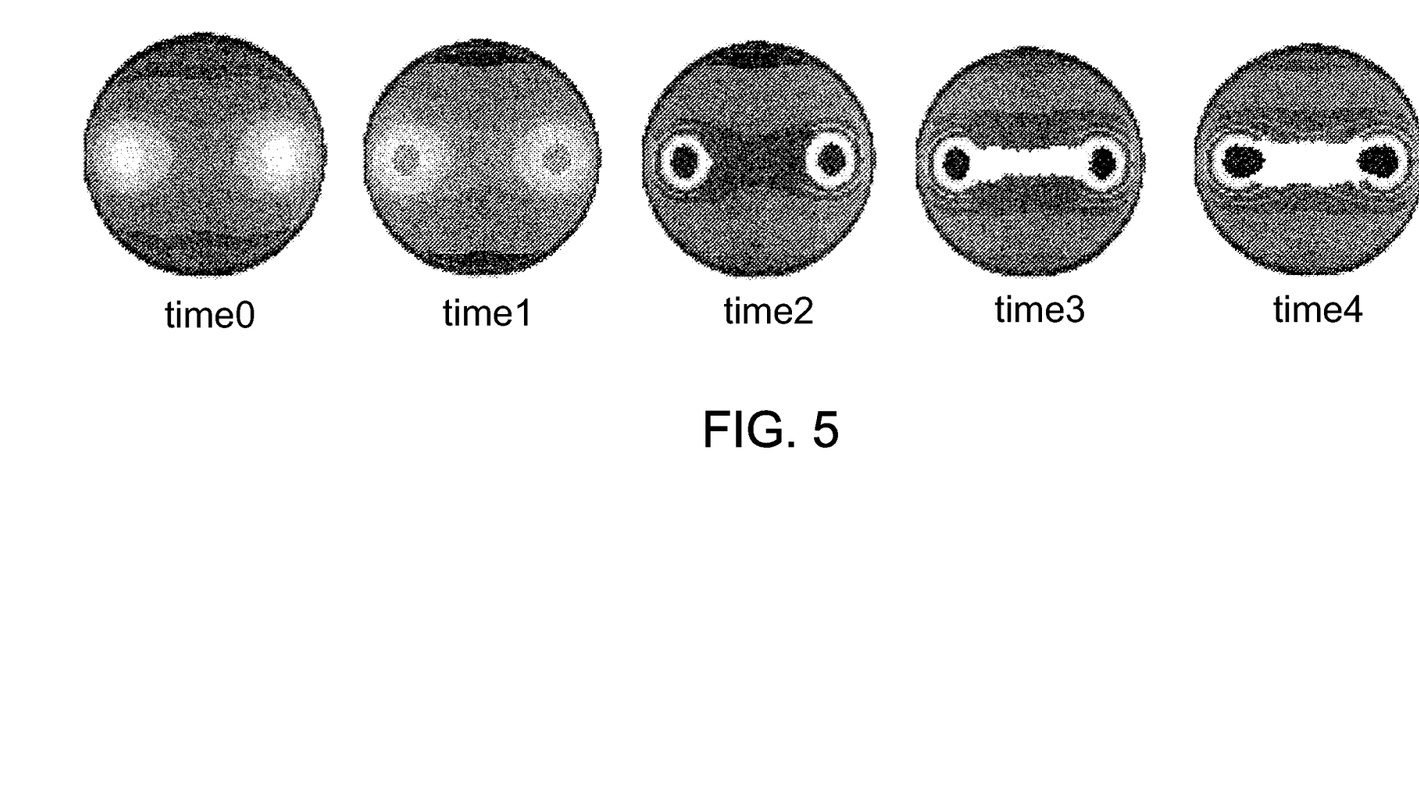
FIG. 5 is an illustration of the development of the temperature distribution over time for dipole illumination settings.

FIG. 5 shows in various charts the temperature distribution in a single lens element of an optical system, for which dipole illumination setting is chosen, at different points of time. The dipole illumination setting is only for illustration purposes so that all other illumination settings, like quadrupole settings or similar, are also conceivable.

As can be seen from FIG. 5, of course the highest temperature is present in the centre of poles, since there most of the radiation is absorbed. However, it can also be seen that the temperature distribution is changing within the lens element during time so that for example between the poles an almost oblong area of high temperature load is formed during time which was not present at the beginning of radiation or had the form of a wasted connecting area. This shows that temperature distribution changes depending on the location or position at the corresponding optical element and depending on the time, until for long operation periods with unchanged image conditions, a stationary condition is developed.

The optical system and the respective process are useable for a plurality of lens arrays, though it is described here in an exemplary manner for projection lens arrays of a microlithography system.

Furthermore, electromagnetic waves can be generally be used, from the visible, and also from the invisible wave length range, though the term light has been used herein in a simplifying manner.

Though the disclosure has been provided with reference to certain embodiments, it is clear and apparent to a person skilled in the art that the disclosure is not restricted to these embodiments and that changes and modifications are possible within the scope of the appended claims, though these changes and modifications may not be described explicitly. In particular, various combinations of particular features of the disclosure, or leaving out certain features, are possible without departing from the scope of the appended claims.

What is claimed is:

1. A method, comprising:
    a) determining at least one of a location-dependent and a time dependent light intensity distribution in an optical element of an optical system;
    b) determining at least one of a location-dependent and a time-dependent absorbed energy in the optical element;
    c) determining at least one deformation and change of optical properties of the optical element caused by the absorbed energy; and
    d) selecting one or several compensation measures, depending on the results of a) through c),
    wherein the at least one of a location-dependent and a time dependent light intensity distribution is determined by a calculation based on a diffraction angle- and location-dependent light intensity distribution,
    wherein the diffraction angle- and location-dependent light intensity distribution is determined based on a measurement of light intensity in at least one plane of the optical system transverse to an optical axis of the optical system, and
    wherein the at least one plane is located between a pupil plane and a field plane of the optical system.

2. The method of claim 1, wherein the at least one plane has a paraxial sub aperture ratio in a range selected from the group consisting of: between −0.75 and −1, and between 0.75 and 1.

3. The method of claim 2, wherein the at least one plane has a paraxial sub aperture ratio in a range selected from the group consisting of: between −0.9 and −1, and between 0.9 and 1.

4. The method of claim 1, wherein the optical system is a projection optical system of a microlithography projection exposure device, and wherein the method is performed for more than one optical element of the projection optical system.

5. The method of claim 1, wherein the optical system comprises multiple optical elements, and the method further comprises determining the light intensity distribution for more than one of the optical elements.

6. The method of claim 1, further comprising, between b) and c), calculating at least one of a location-dependent and a time dependent temperature distribution in the optical element through a solution or an approximated solution of heat transfer equations.

7. The method of claim 6, wherein calculating the temperature distribution comprises using at least one of information about a shape of the optical element, a material of the optical element, an absorption property of a coating applied to the optical element, an environment of the optical element, and a mounting of the optical element.

8. The method of claim 1, wherein c) is carried out once.

9. The method of claim 1, wherein c) is performed based on knowledge of at least one member selected from the group consisting of imparted energy, location and time based temperature distributions, deformations, changes of optical features of the optical element, material of the optical element, shape of the optical element, environmental conditions of the optical element, thermal expansion coefficients of the optical element, temperature dependency of the refractive index of the optical element, diffraction angle distribution, and illumination intensity.

10. The method of claim 1, further comprising storing information used or determined in at least one of a), b), c), and d).

11. The method of claim 1, wherein the light intensity is measured to determine the diffraction angle- and location-dependent light intensity distribution before a).

12. The method of claim 1, further comprising measuring the light intensity during a scan illumination of an object to be imaged, wherein the measurement of light intensity is integrated, time resolved, or averaged over the scan process.

13. The method of claim 12, wherein the scan illumination is performed in a slowed down time mode compared to normal operation during light intensity measurement.

14. The method of claim 1, wherein the light intensity measurement comprises at least one member selected from the group consisting of: detecting an incident angle distribution of light in a field-close plane of the optical system, and detecting a position-resolved light intensity distribution in a pupil-close plane of the optical system.

15. The method of claim 1, further comprising measuring the light intensity using a diffraction grating detector unit in an image plane of the optical system.

16. The method of claim 15, wherein the diffraction grating detector unit comprises a pinhole.

17. The method of claim 1, wherein the light intensity measurement is performed by an image detector or a CCD camera.

18. The method of claim 1, wherein the light intensity measurement is performed during an exchange of a substrate to be exposed using the optical system.

19. The method of claim 1, wherein the intensity measurement is only performed once or in defined intervals for a given image condition of the optical system.

20. The method of claim 1, wherein the light intensity measurement is performed after a change of image conditions of the optical system.

21. The method of claim 20, wherein the change of image condition occurs by at least one member selected from the group consisting of changing an illumination setting, changing an object to be imaged, changing a reticle, modifying an optical element, rotating an optical element, displacing an optical element, and deforming an optical element.

22. The method of claim 1, wherein b) is performed by calculation.

23. The method of claim 22, wherein the calculation is performed using at least one member selected from the group consisting of a shape of the optical element, a material of the optical element, an absorption property of the optical element, an environment of the optical element, and a mounting of the optical element.

24. The method of claim 23, further comprising determining the absorption property of the optical element experimentally.

25. The method of claim 22, wherein b) comprises at least one member selected from the group consisting of finite element analysis, finite difference method, Eigenmode-analysis, iterative numerical methods, and analytical assessments.

26. The method of claim 1, further comprising determining the at least one deformation of the optical element by calculation.

27. The method of claim 26, wherein the calculation of the at least one deformation is performed by finite element analysis.

28. The method of claim 1, wherein c) comprises using a thermal expansion coefficient of a material of the optical element and a refraction coefficient of the material of the optical element to determine the at least one deformation and change of optical properties.

29. The method of claim 1, wherein d) comprises selecting one or several compensation measures based on changes of the optical system.

30. The method of claim 1, wherein the compensation measures comprise at least one member selected from the group consisting of:
shifting one or several optical elements along or orthogonal to the optical axis;
tilting or rotating one or several optical elements around an axis transverse or parallel to the optical axis;
deforming one or several optical elements;
moving at least one of a reticle and a substrate table;
changing a wave length of exposure light used; and
cooling and heating of at least part of the optical element.

31. The method of claim 1, wherein the method is at least partially automated.

32. The method of claim 1, wherein the method is executed multiple times in a row.

33. The method of claim 1, wherein the method is executed multiple times in a row with light intensity measurements in different planes along an optical path of the optical system.

34. The method of claim 1, wherein the method is performed online during use of the optical system to expose a light-sensitive substrate.

35. The method of claim 34, wherein the method is performed after an intermediary measurement of light intensity.

36. The method of claim 1, wherein the method is performed only once for an object to be imaged at a constant illumination.

37. A method, comprising:
a) determining at least one of a location-dependent and a time dependent light intensity distribution in an optical element of an optical system;
b) determining at least one of a location-dependent and a time-dependent absorbed energy in the optical element;
c) determining at least one deformation and change of optical properties of the optical element caused by the absorbed energy; and
d) selecting one or several compensation measures, depending on the results of a) through c),
wherein the at least one of a location-dependent and a time dependent light intensity distribution is determined by a calculation based on a diffraction angle- and location-dependent light intensity distribution,
wherein the diffraction angle- and location-dependent light intensity distribution is determined based on a measurement of light intensity in two planes of the optical system transverse to an optical axis of the optical system, and
wherein a prefix of a paraxial sub aperture ratio for a first one of the two planes is different from a prefix of a paraxial sub aperture ratio for a second one of the two planes.

38. The method of claim 37, wherein each of the two planes is located between a pupil plane and a field plane of the optical system.

39. The method of claim 37, wherein each of the two planes has a paraxial sub aperture ratio in a range selected from the group consisting of: between $-0.75$ and $-1$, and between $0.75$ and $1$.

40. The method of claim 37, wherein the light intensity measurement is performed after a change of image conditions of the optical system, and wherein the change of image conditions occurs by at least one member selected from the group consisting of changing an illumination setting, changing an object to be imaged, changing a reticle, modifying an optical element, rotating an optical element, displacing an optical element, and deforming an optical element.

41. The method of claim 37, wherein b) is performed by calculation, and wherein the calculation is performed using at least one member selected from the group consisting of a shape of the optical element, a material of the optical element, an absorption property of the optical element, an environment of the optical element, and a mounting of the optical element.

42. The method of claim 37, wherein c) comprises using a thermal expansion coefficient of a material of the optical element and a refraction coefficient of the material of the optical element to determine the at least one deformation and change of optical properties.

43. The method of claim 37, wherein the compensation measures comprise at least one member selected from the group consisting of:
   shifting one or several optical elements along or orthogonal to the optical axis;
   tilting or rotating one or several optical elements around an axis transverse or parallel to the optical axis;
   deforming one or several optical elements;
   moving at least one of a reticle and a substrate table;
   changing a wave length of exposure light used; and
   cooling and heating of at least part of the optical element.

44. The method of claim 37, wherein the method is performed online during use of the optical system to expose a light-sensitive substrate.

45. A method, comprising:
   a) determining at least one of a location-dependent and a time dependent light intensity distribution in an optical element of an optical system;
   b) determining at least one of a location-dependent and a time-dependent absorbed energy in the optical element;
   c) determining at least one deformation and change of optical properties of the optical element caused by the absorbed energy; and
   d) selecting one or several compensation measures, depending on the results of a) through c),
   wherein the at least one of a location-dependent and a time dependent light intensity distribution is determined by a calculation based on a diffraction angle- and location-dependent light intensity distribution,
   wherein the diffraction angle- and location-dependent light intensity distribution is determined based on a measurement of light intensity in multiple planes of the optical system transverse to an optical axis of the optical system, and
   wherein each of the multiple planes has a paraxial sub aperture ratio, and the paraxial sub aperture ratios for each of the multiple planes are equidistantly spaced from one another.

46. The method of claim 45, wherein each of the multiple planes is located between a pupil plane and a field plane of the optical system.

47. The method of claim 45, wherein each of the multiple planes has a paraxial sub aperture ratio in a range selected from the group consisting of: between −0.75 and −1, and between 0.75 and 1.

48. The method of claim 45, wherein the light intensity measurement is performed after a change of image conditions of the optical system, and wherein the change of image conditions occurs by at least one member selected from the group consisting of changing an illumination setting, changing an object to be imaged, changing a reticle, modifying an optical element, rotating an optical element, displacing an optical element, and deforming an optical element.

49. The method of claim 45, wherein b) is performed by calculation, and wherein the calculation is performed using at least one member selected from the group consisting of a shape of the optical element, a material of the optical element, an absorption property of the optical element, an environment of the optical element, and a mounting of the optical element.

50. The method of claim 45, wherein c) comprises using a thermal expansion coefficient of a material of the optical element and a refraction coefficient of the material of the optical element to determine the at least one deformation and change of optical properties.

51. The method of claim 45, wherein the compensation measures comprise at least one member selected from the group consisting of:
   shifting one or several optical elements along or orthogonal to the optical axis;
   tilting or rotating one or several optical elements around an axis transverse or parallel to the optical axis;
   deforming one or several optical elements;
   moving at least one of a reticle and a substrate table;
   changing a wave length of exposure light used; and
   cooling and heating of at least part of the optical element.

52. The method of claim 45, wherein the method is performed online during use of the optical system to expose a light-sensitive substrate.

* * * * *

UNITED STATES PATENT AND TRADEMARK OFFICE
CERTIFICATE OF CORRECTION

PATENT NO. : 8,325,323 B2
APPLICATION NO. : 12/361842
DATED : December 4, 2012
INVENTOR(S) : Olaf Conradi et al.

Page 1 of 1

It is certified that error appears in the above-identified patent and that said Letters Patent is hereby corrected as shown below:

Column 6,
Line 67, delete "and in" and insert --and--

Signed and Sealed this
Twelfth Day of March, 2013

Teresa Stanek Rea
*Acting Director of the United States Patent and Trademark Office*